(12) United States Patent
Lojek

(10) Patent No.: US 7,439,567 B2
(45) Date of Patent: Oct. 21, 2008

(54) CONTACTLESS NONVOLATILE MEMORY ARRAY

(75) Inventor: Bohumil Lojek, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 81 days.

(21) Appl. No.: 11/463,430

(22) Filed: Aug. 9, 2006

(65) Prior Publication Data

US 2008/0035982 A1    Feb. 14, 2008

(51) Int. Cl.
*H01L 29/94* (2006.01)
*H01L 21/336* (2006.01)
*G11C 11/34* (2006.01)
*G11C 11/04* (2006.01)

(52) U.S. Cl. .................... 257/298; 257/261; 257/314; 257/315; 257/E21.103; 257/E29.17; 438/201; 438/211; 438/257

(58) Field of Classification Search ............... 257/315, 257/261, 314, E21.645, E29.17, E21.67, 257/E21.673, E21.681, 298; 365/185.01, 365/185.05, 185.1, 185.18, 185.12; 438/201, 438/211

See application file for complete search history.

(56) References Cited

U.S. PATENT DOCUMENTS

| | | | |
|---|---|---|---|
| 4,683,554 A * | 7/1987 | Lockwood et al. | 365/185.02 |
| 4,748,593 A | 5/1988 | Topich et al. | |
| 4,829,351 A | 5/1989 | Engles et al. | |
| 5,313,421 A | 5/1994 | Guterman et al. | |
| 5,526,307 A | 6/1996 | Yiu et al. | |
| 6,624,027 B1 | 9/2003 | Daemen et al. | |
| 6,649,453 B1 * | 11/2003 | Chen et al. | 438/130 |
| 6,905,926 B2 | 6/2005 | Lojek | |
| 6,998,670 B2 | 2/2006 | Lojek | |
| 7,057,235 B2 | 6/2006 | Lojek | |
| 7,061,801 B1 | 6/2006 | Wong | |
| 2004/0119112 A1 | 6/2004 | Lojek | |
| 2004/0212003 A1 | 10/2004 | Lojek | |
| 2006/0244042 A1 * | 11/2006 | Jeon et al. | 257/315 |

OTHER PUBLICATIONS

K.M. Chang et al., "A modular flash EEPROM technology for 0.8 um high speed logic circuits," Custom Integrated Circuits, 1991, Proceedings of the IEEE, 18.7/1-18.7/4.
"International Application Serial No. PCT/US2007/73668, International Search Report mailed May 2, 2008", 8 pgs.
"International Application Serial No. PCT/US2007/73668, International Written Opinion mailed May 2, 2008", 8 pgs.

* cited by examiner

*Primary Examiner*—Long K Tran
(74) *Attorney, Agent, or Firm*—Schwegman, Lundberg & Woessner P.A.

(57) ABSTRACT

An array of memory cells with non-volatile memory transistors having a compact arrangement of diagonally symmetric floating gates. The floating gates have portions extending in both X and Y directions, allowing them to be charged through a common tunnel oxide stripe that runs under a portion of each, for example a portion running in the X-direction while the two Y-direction portions serve to establish a channel. Shared source/drain regions are established between and in proximity to the Y-direction portions to define two non-volatile memory transistors in each memory cell. Memory cells are replicated in the word line direction and then mirrored with respect to the word line to form the next row or column. This geometry is contactless because the word line and source/drain regions are all linear throughout the array so that electrical contact can be established outside of the array of cells. Each transistor can be addressed and thus programmed and erased or pairs of transistors in a line can be erased, i.e., sector erase.

20 Claims, 4 Drawing Sheets

CONTACTLESS NONVOLATILE MEMORY ARRAY

TECHNICAL FIELD

The invention relates to nonvolatile memory transistors and, in particular, to a compact arrangement of memory cells forming a memory array and a method of making the array.

BACKGROUND OF THE INVENTION

In the prior art, a nonvolatile memory array usually consists of a plurality of memory cells aligned in rows and columns, with each memory cell having one or more transistors. Various strategies have been employed to build multibit cells, with a typical requirement that there be two floating elements that can be controlled independently. For example, in prior application Ser. No. 10/4423,637 entitled, "Mirror Image Memory Cell Transistor Fairs Featuring Poly-Floating Spacers", assigned to the assignee of the present invention, B. Lojek described an arrangement of nonvolatile MOS memory transistors for memory array wherein symmetric pairs of transistors shared a drain electrode in a common well, but were otherwise completely independent. The pair was manufactured between a pair of isolation regions and so shared the same substrate region, almost as if a single transistor were constructed there. A different approach was employed in prior application Ser. No. 10/427,336 entitled, "Multi-Level Memory Cell with Lateral Floating Spacers", assigned to the assignee of the present invention. In this instance, a single MOS floating gate transistor stored two data bits using two spacers, on opposite sides of the conductive gate. The spacers behave as independent charge storage regions for separate binary data, thereby allowing a single nonvolatile MOS transistor to store two binary bits. Each memory cell was connected to two bit lines and one word line. The bit lines are phased so that during a single clock cycle, first one bit line is active and then the other while a word line is active for the entire cycle. In this manner, both storage areas may be accessed for a read or a write operation.

One of the limits to compactness of the memory array is set by contacts to transistor electrodes. In the prior art, contactless geometries have been devised that reduce the number of transistor contacts to single lines that communicate with electrodes in each cell. This is done by building memory arrays with a stripe geometry, with stripes running in both X and Y directions. The stripes are either conductors above the surface of a wafer substrate or doped conductive regions in the substrate, or both. The stripes form lines which run through individual cells in a manner that allows addressing for writing, erasing, and reading. For example, see U.S. Pat. No. 7,061,801 to Wang.

Once this level of compactness has been achieved, an object of the invention is to achieved are used.

SUMMARY OF INVENTION

A nonvolatile memory array has been devised having closely packed memory cells in a contactless X-Y array. In this application the term "cell", has primarily a geometrical meaning, based upon closely spaced, symmetrically spaced floating gates, as well as an electrical meaning, based upon electrode sharing. Each geometrical cell not on an edge requires electrical communication with two adjacent shared source/drain electrodes, one left and one right, in order to form a pair of EEPROM transistors using two floating gates within the cell, as well as shared transverse word line electrode. The geometrically defined cells are characterized by each cell having two diagonally symmetric floating gates, a single thin window line that underlies both floating gates, a single shared source/drain line between the two transistors, a transverse word line, as well as the two adjacent shared electrodes, previously mentioned. With only three lines per transistor, each transistor can be individually written to or erased, as well as blocks of cells which may also be simultaneously written to or erased. The fact that there are two floating gates per memory cell implies information density of two independent bits per cell. The reduced number of lines needed to operate the memory array, as well as the compact arrangement of floating gates, allow for construction of an ultra compact memory array.

Figure 1:
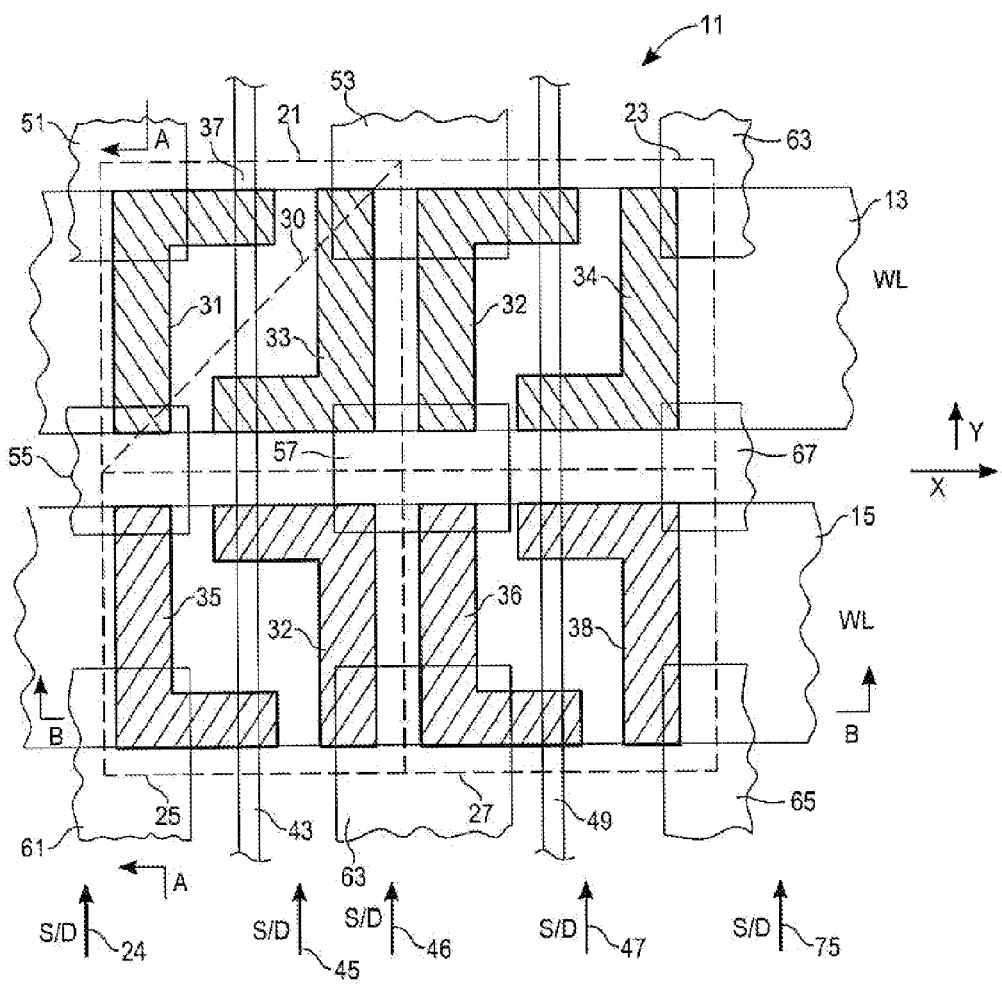
FIG. 1 is a top view of overlying masks showing principle components of a memory array in accordance with the present invention.

FIG., 4 is an electrical schematic of a portion of a memory array of the type shown in FIG. 1.

Figure 5:
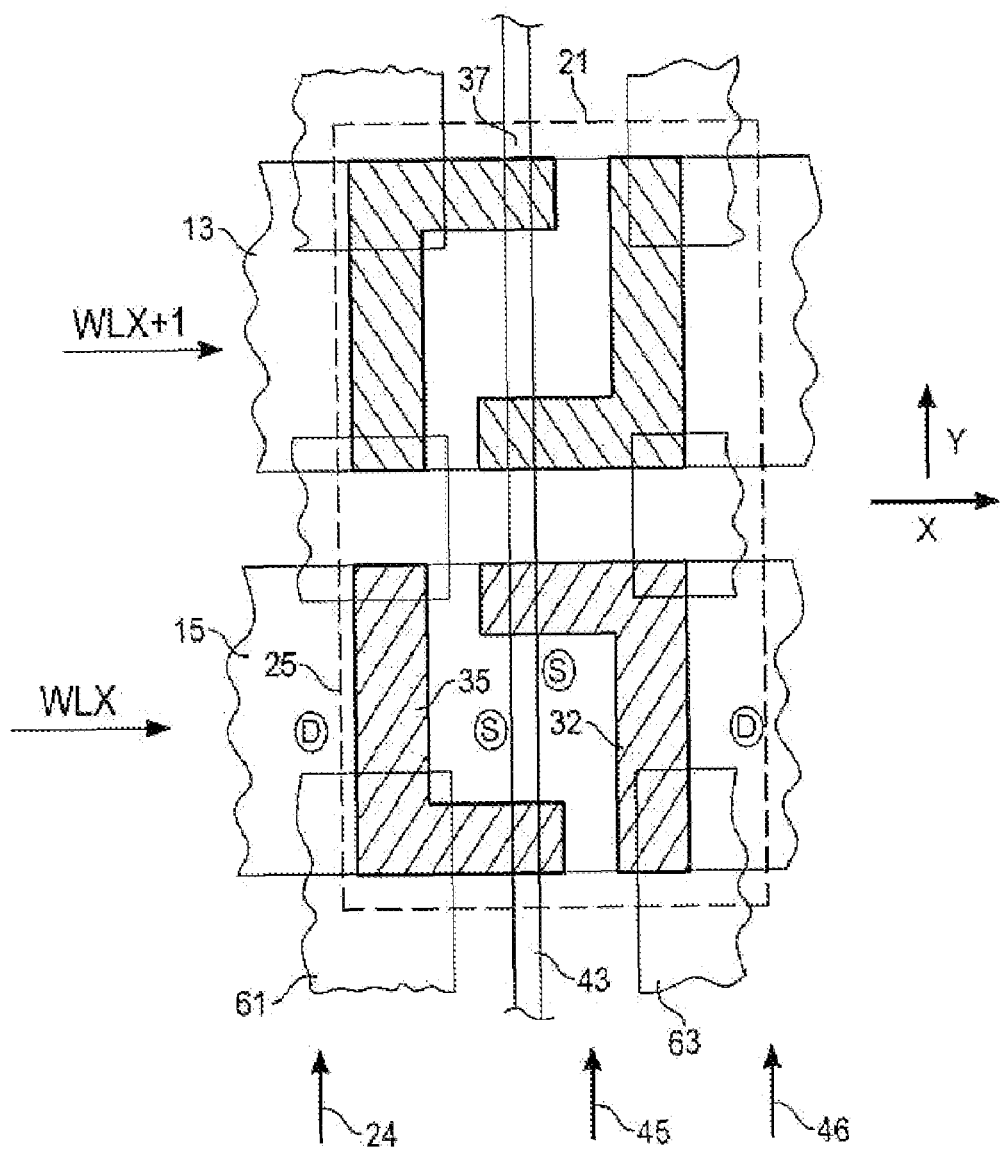

FIG. 5 is a top view of a representative region of the memory array of FIG. 1.

Figure 6:
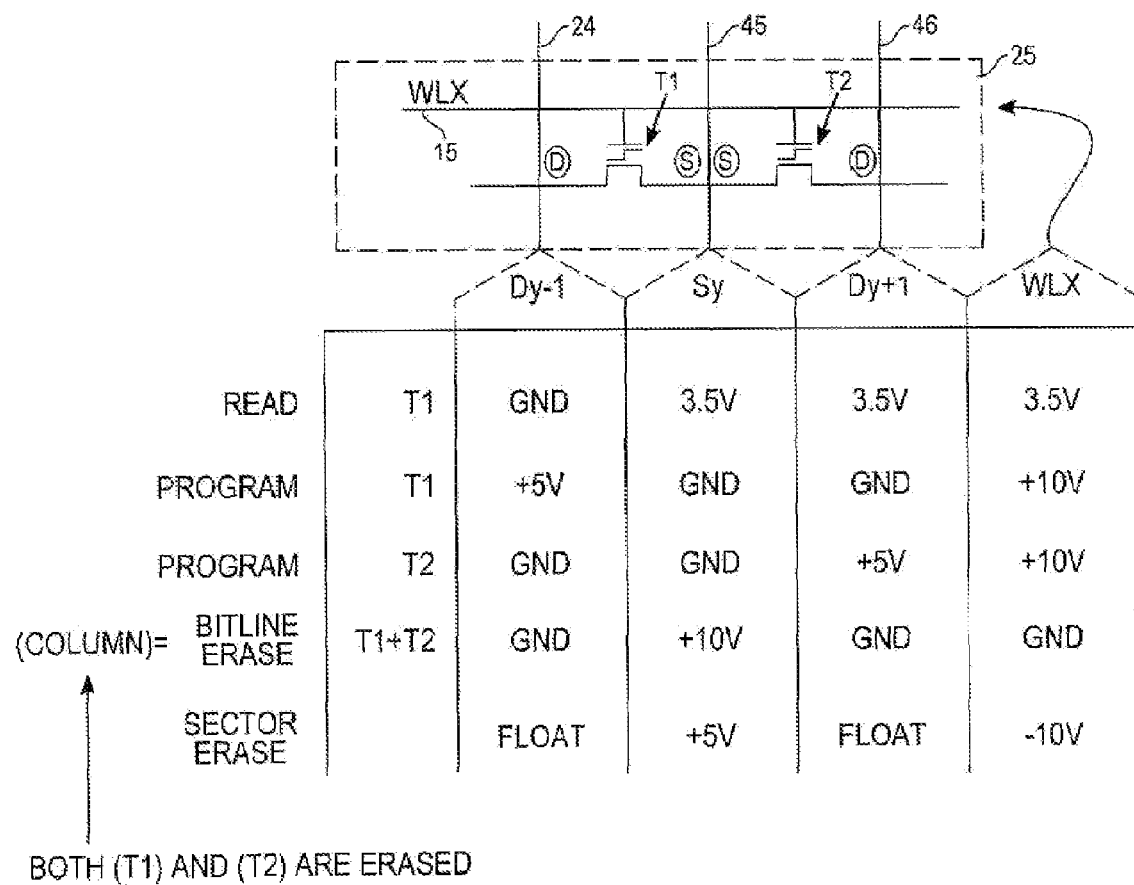

FIG. 6 is an electrical schematic for a transistor pair of a cell of the memory array shown in FIG. 5.

DESCRIPTION OF INVENTION

With reference to FIG. 1, a portion of a X-Y memory array is shown to have relatively broad word lines, compared to other features, 13 and 15, running in the X direction. The word lines are parallel, uniformly spaced apart and are the highest level mask of those shown. Ultimately, the word lines will be fabricated of conductive polysilicon, with each line acting as a control gate for selected memory transistors.

The next level mask is a mask defining floating gates which are charge storage regions. All floating gates, indicated by hatched lines, are on the same level and all are beneath a corresponding word line. For the sake of convenient discussion of the floating gates, the memory array is divided into a number of rectangular cells, indicated by dashed lines. For example, the cells 21 and 23 are neighboring cells in the X-direction parallel to word line 13. On the other hand, directly below cells 21 and 23 are cells 25 and 27, contiguous with cells 21 and 23 and parallel to them. The cells in one horizontal row are mirrored in an adjacent horizontal row. In the Y-direction, memory cell 21 is above cell 25 and cell 23 is above cell 27. The cells are closely packed and while no cell contains a complete floating gate transistors the fact that there are two floating gates per memory cell gives an overall EEPROM transistor memory density of two transistors per cell. The two transistors rely upon shared source/drain electrodes in neighboring cells to form complete EEPROM transistors.

In cell 21 floating gates 31 and 33 will be formed of polysilicon above a substrate of the device. The floating gates 31 and 33 are seen to be L-shaped and are flipped X and Y images of each other. The X and Y flips result in diagonal symmetry, as indicated by the dashed line 30. It is not necessary to have an L shape for the floating gates, but a floating gate made of a vertical and horizontal line could be used. For example, a J shape or a reverse J shape is similar to an L shape except that the base of the L is rounded. A J shape is not convenient in lithography, but the base of an TL shape may become rounded in lithography processing.

The base of each L communicates with a tunnel window, specifically in tunnel window stripe 37. The diagonal symmetry of the floating gates is a geometric correspondence rather than strict transformation (flipping). For example, the two L-shaped members need not have the same size or one member may have an L-shape and the other member a J-shape. The portion of the floating gate extending in the Y-direction, i.e., vertically, is the portion of the floating gate which has a channel underneath. The region between the two floating gates, in the substrate, is a subsurface implant region, i.e., a doping along the Y-direction that is a shared source/drain ("S-D") region, for example, indicated by S-D arrow 45.

In the same direction as the S-D region 45 is the tunnel window stripe 37 which is fabricated immediately above the substrate but below horizontal portions of the floating gate members. For example, the tunnel oxide stripe 37 may be seen to be extending in the Y-direction, passing beneath the base portions of the L-shaped floating gates 31 and 33, as well as running beneath portions of the floating gate regions 35 and 32 in cell 25. A second S-D region 46 extends in the Y-direction on the border of cells 21 and 23, indicated by S-D arrow 46. A third S-D region is indicated by S-D arrow 24 being parallel to S-D region 45 with all S-D regions running in the Y-direction. Other S-D regions are indicated by S-D arrows 47 and 75 wherein S-D regions 46, 47, and 75 serve as source/drain/source electrodes, respectively for the pairs of EEPROM memory transistors in cell 23 and cell 27. These S-D regions are doped regions in the substrate that have no contacts in the X-Y memory array but have contacts outside of the array.

Each memory cell has two floating gate regions, with each floating gate associated with two source/drain regions in the Y-direction, a parallel tunnel window stripe, and a transverse word line stripe in the X-direction. For example, floating gate 33 is associated with S-D regions 45, 46, tunnel oxide stripe 37 and word line 13. The tunnel window stripe are actually depressions in an oxide layer in stripe-like linear patterns 43 and 49. In floating gate nonvolatile memories thin windows are frequently manufactured as small square depressions, but in the present case, the thin window is a linear pattern such as the lines 43 and 49. The tunnel window stripe has an advantage of easier lithographic processing without pattern distortion or necessity of using optical proximity corrections.

Each of the memory cells is seen to have trench isolation at corners of the cell. For example, memory cell 21 has trench isolation regions 51, 53, 55, and 57 in the four corners of the cell. Similarly, cell 23 has the trench isolation regions 53, 63, 57, and 67. Cell 25 has the trench regions 55, 57, 61, and 63 in corners of the cell. Cell 27 has the trench regions 57, 67, 63, and 65 in the corners of the cell. Note that trench regions are shared. The trench regions exist in the substrate and are usually filled with oxide as barriers between neighboring devices to eliminate parasitic capacitance and disturb voltages.

As described above, each cell will be seen to have two floating gate transistors, such as transistor having a floating gate that L-shaped, one, thin window stripe, a pair of shared S-D regions, all running in the Y-direction, plus a shared word line running in the X-direction. The L-shaped portions of conductive floating gates are superposed with portions of a word line stripe, a source/drain stripe region, and a tunnel window strip in top view. Transistor action occurs between source/drain regions where a channel is formed between the two source/drain regions. Accordingly, four transistors exist in two neighboring cells in the X-direction. For example, source/drain region 45 is associated with floating gate 33 together with source/drain region 46, both square/drain regions 45 and 46 having a channel between them. The floating gate 33 would have charge communicated to and from the source/gate regions through the tunnel oxide stripe 37. Word line 13 would provide the control voltage for charge transfer. In cell 23, floating gate region 32 would be operated by source/drain regions 46 and 47 so that effectively there are two back-to-back floating gate memory transistors in cells 21 and 23, both floating gate transistors sharing the sane source/drain region indicated by S-D line 46. Both transistors are operated by word line 13.

Figure 2:
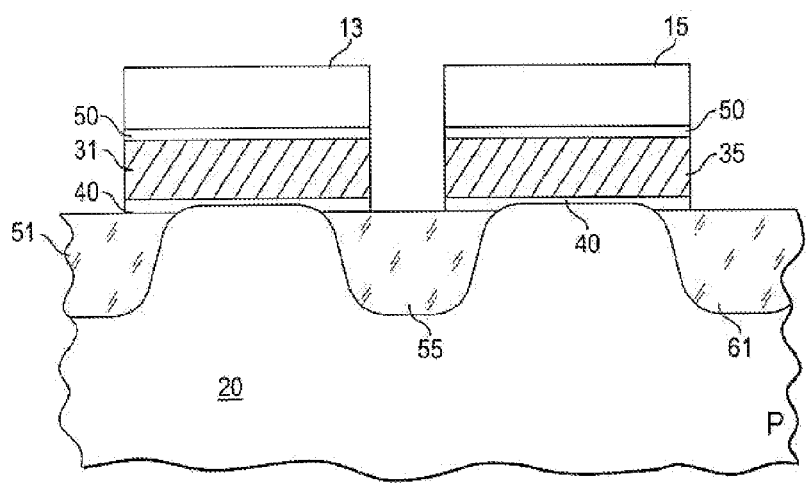
FIG. 2 is a side sectional view of the portion of the array shown in FIG. 1 taken along lines A-A.

With reference to FIG. 2, trench regions 51, 55, and 61 are seen to separated device portions. The trench regions are shallow and filled with oxide in a conventional STI oxidation process. Floating gate 31, like the other floating gates, is made of conductive polysilicon and is spaced above semiconductor substrate 20 by a layer of thin oxide 40. Word line 13 is a conductive control line separated by ONO insulator layer 50. A portion of another device in cell 25 of FIG. 1 consists of the control member 15, part of a word line, which is spaced by ONO insulator layer 50 above the floating polysilicon charge storage member 35. In turn, the floating gate member 35 is spaced by gate oxide layer 40 above the p-type substrate 20.

Figure 3:
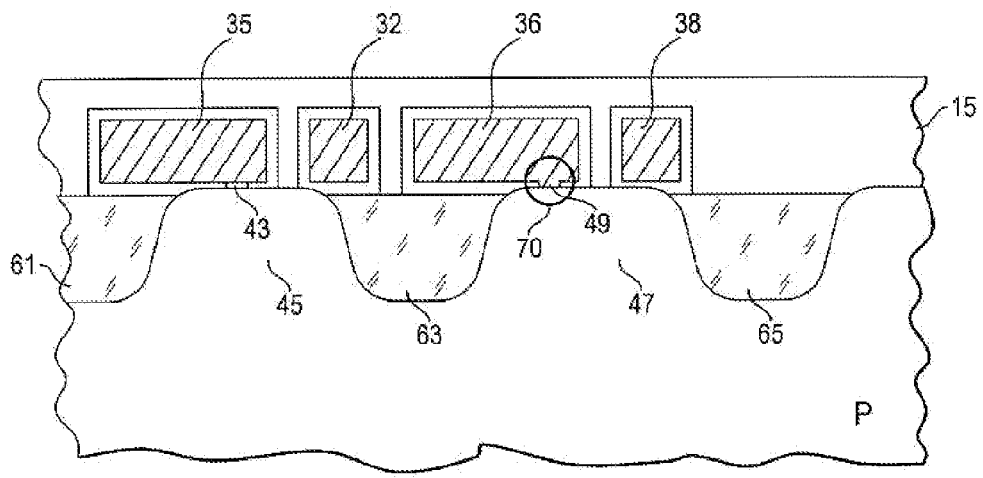
FIG. 3 is a side sectional view of the portion of the array shown in FIG. 1, taken along lines BB.

In the sectional view of FIG. 3, the control layer 15 is seen to reside above polysilicon members 35 and 37, associated with memory cell 25 in FIG. 1 with floating gate members 36 and 38 are associated with memory cell 27 in FIG. 1. Source/drain regions 45 and 47 have another source/drain region 46 therebetween which a is not seen in FIG. 3 because the shallow trench insulator 63 prevents any view of the region. The source/drain regions communicate charge to and from the floating gate members 35, 32, 36, and 38 by Fowler-Nordheim tunneling, or otherwise. The floating gates become charged when an appropriate voltage is on control line 15 and the source drain regions. Transistors can be addressed individually or as a group.

Figure 3A:
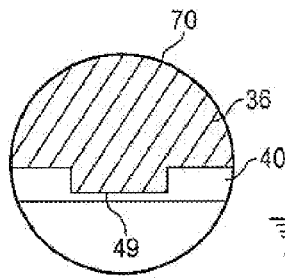
FIG. 3A is a magnified portion of FIG. 3 within the circle 70 of FIG. 3.

Floating gate members 35 aid 38 have thin window regions 43 and 49, respectively. These are regions where the thin oxide separating polysilicon from the substrate is extremely thin roughly 10 to 20 Angstroms. The thin windows are made in a manner described in U.S. Pat. No. 6,624,027 entitled, "Ultra Small Thin Windows in Floating Gate Transistors Defined by Lost Nitride Spacers", assigned to the assignee of the present invention. In that patent, the tunnel oxide window is made with dimensions smaller than the minimum feature resolution of process equipment. Such a narrow feature is made by placing dummy nitride spacers on either side of a nitride implant mask over a gate oxide layer after the source and drain are formed by implantation at opposite sides of the nitride mask. The spacers are formed in a second nitride layer deposit after the nitride mask formation. The spacers are etched to have a desired tunnel oxide dimension and other oxide layers deposited over one of the source and drain layers, abutting a nitride spacer. The nitride layers are removed, leaving a spacer nest into which tunnel oxide is deposited. While gate oxide separates floating gate members 35, 32, 36, and 38 from the substrate, apart from the tunnel oxide, an ONO insulation layer 50, seen in FIG. 2, provides insulative spacing between the same members and word lines 15 and 13 which serve as a polysilicon control gates for the cells. The tunnel oxide layer 49, seen in FIG. 3A is substantially thinner than gate oxide 40. The outline of the tunnel oxide layer defines the tunnel window, here manufactured as a stripe.

Figure 4:
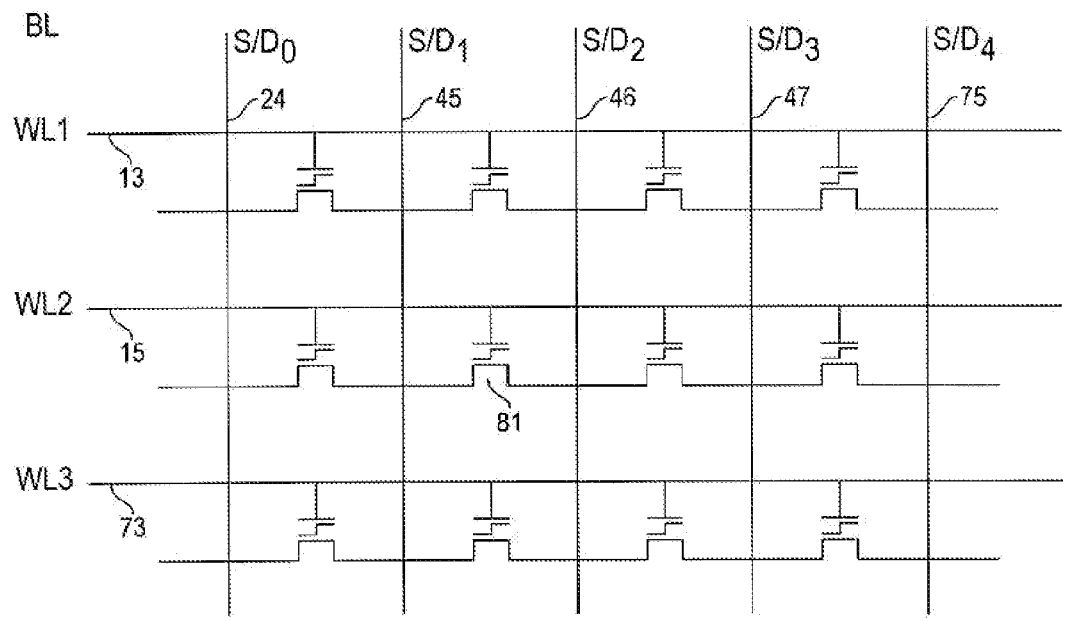

With reference to FIG. 4, an electrical drawing is shown with word lines 13, 15, and 73 extending in the X-direction and source/drain lines 24, 45, 46, 47, and 75 extending in the Y-direction. A pair of adjacent source/drain lines, plus one word line control operation of one of the floating gate transistors, such as transistor 81. In particular, transistor 81 is controlled by source lines 45 and 46 as well as word line 15.

With reference to FIG. 5, memory cell 25 is seen to have two diagonally mirrored floating gates 35 and 32. Between the two floating gates is the source/drain region 45 that will be considered solely as a source region, termed Sy. On opposite sides of floating gates 35 and 32 are source/drain regions 24 and 46, indicated by vertical arrows in the Y-direction, that will be considered as drain regions $D_{y-1}$ and $D_{y+1}$. Operative drain and source regions are labeled D and S. The word line 15 covering the cell runs in the X-direction and will be considered as WLx. The source and drain regions, together with the word line, define two floating gate memory transistors in memory cell 25. Another two transistors in mirror image relation, are found in memory cell 21. Note that the two transistors in memory cell 21 have the same bit lines, namely bit lines formed by drain lines 24 and 46, as well as source line 45. The transistors also share the same gate oxide line 37. However, the two cells have different word lines, namely word lines 13 and 15.

The memory cell 25 has the electrical plan of FIG. 6 wherein the word line 15 of memory cell 25 corresponds to WLx in FIG. 5 and is connected to the control gate of the non-volatile memory transistors T1 and T2. The drain lines 24 and 46 run in the Y-direction on the opposite far sides of the two transistors while the shared source line 45 runs between the two transistors. Read, program, and erase voltages are shown on the diagram.

In operation, various voltages are applied for reading, programming, bit-erasing, and sector erasing of memory cells. The table in FIG. 6 shows voltages for memory cells that are selected by means of word lines in the X-direction and bit lines in the Y-direction.

What is claimed is:

1. A non-volatile memory array with a plurality of memory transistors having X-Y alignment on a semiconductor substrate comprising:
    a plurality of spaced apart, parallel, conductive, word line stripes over a substrate extending in the X-direction;
    a plurality of spaced apart pairs of conductive floating gate members beneath each of the word lines but above the substrate, with pairs of floating gate members beneath different word lines having regions aligned in the X-direction, the pairs of floating gate members associated with a tunnel window region with each pair of floating gate members aligned such that tunnel window regions of a pair of floating gate members are in a single tunnel window stripe extending in the Y-direction under the pair of floating gate members, the plurality of pairs of floating gate members having a plurality of corresponding spaced apart, parallel tunnel window stripes; and
    a plurality of spaced apart, parallel, conductive source/drain stripes running under pairs of conductive floating gate members within the substrate, each source/drain stripe electrically shared by adjacent floating gate members;
    whereby two adjacent source/drain stripes and one word line are electrically selected to write and to erase at least one conductive floating gate member acting as a single non-volatile memory transistor corresponding to a single X-Y location, with a plurality of such transistors at different X,Y locations constituting a memory array.

2. The memory array of claim 1 wherein pairs of conductive floating gate members are diagonally symmetric.

3. The memory array of claim 1 wherein pairs of conductive floating gate members in one row are mirrored in an adjacent row.

4. The memory array of claim 1 wherein pairs of conductive floating gate members are L-shaped.

5. The memory array of claim 1 wherein pairs of conductive floating gate members share a word line, a tunnel window stripe, and a source/drain stripe in a superposed relation seen in top view.

6. A method of making a non-volatile memory array having X-Y alignment of a semiconductor substrate comprising:
    forming diagonally symmetric pairs of floating gates with portions of each floating gate member having portions in the X and Y directions, each pair of floating gates members defining a memory cell;
    forming linear source/drain regions in the substrate in one of the X and Y directions, with adjacent pairs of source/drain regions in electrical communication with one of floating gate members, wherein the source/drain regions are doped regions in the substrate that have no contacts in the X-Y memory array but have contacts outside of the array; and
    forming a linear word line in insulated-relation over the floating gates in the other of the X and Y directions, in electrical communication with pairs of floating gate members.

7. The method of claim 6 further defined by providing a linear tunnel oxide stripe parallel to the linear source/drain regions.

8. The method of claim 6 further defined by making adjacent cells in the same row identical.

9. The method of claim 6 further defined by making cells in one row a mirror image of cells in an adjacent row.

10. The method of claim 6 further defined by making the floating gate members L-shaped or J-shaped.

11. A contactless X-Y array of closely packed memory cells, each memory cell comprising:
    a pair of non-volatile memory transistors each having a floating gate above a semiconductor substrate, extending partly in the X-direction and partly in the Y-direction;
    a tunnel window stripe above a semiconductor substrate running in one of the X- and Y-directions crossing under a portion of each of the floating gates;
    three linear source/drain regions, including first and second linear source/drain regions on opposite sides of the transistor pairs and a third shared linear source/drain region between transistors of the transistor pair, the three linear source/drain regions within the semiconductor substrate extending in a direction parallel to the tunnel window stripe; and
    a linear word line stripe over the floating gates in a direction orthogonal to the linear source/drain regions;
    whereby electrical contact is made with the three source/drain regions outside of said memory cells to form a contactless memory array, wherein the source/drain have no contacts in a X-Y memory array.

12. The array of claim 11 wherein each floating gate is L-shaped.

13. The array of claim 11 wherein each floating gate is J-shaped.

14. The array of claim 11 wherein the floating gates are diagonally mirrored in each cell.

15. The array of claim 11 wherein each floating gate has a first portion crossing over a tunnel window stripe and a second portion over a region between one of the first and second linear source/drain regions on the one hand and the third linear source/drain region on the other hand.

16. A contactless X-Y array of closely packed memory cells in a memory array, each memory cell comprising:
- a pair of diagonally symmetric floating gates in non-volatile memory transistors;
- parallel source and drain linear regions communicating electrical charge to the floating gates; and
- a control line over the floating gates orthogonal to the source and drain linear regions, the source and drain regions and the control line having electrical contact outside of said memory cell, wherein the source/drain have no contacts in a X-Y memory array.

17. The array of claim 16 wherein a tunnel window stripe is in electrical communication with both floating gates of a memory cell.

18. The array of claim 16 wherein said floating gates are L-shaped.

19. The array of claim 16 wherein said floating gates are J-shaped.

20. The array of claim 17 wherein the source and drain linear regions of a cell are parallel to the window stripe.

* * * * *

UNITED STATES PATENT AND TRADEMARK OFFICE
CERTIFICATE OF CORRECTION

PATENT NO. : 7,439,567 B2
APPLICATION NO. : 11/463430
DATED : October 21, 2008
INVENTOR(S) : Bohumil Lojek It is certified that error appears in the above-identified patent and that said Letters Patent is hereby corrected as shown below:

On the face page, in field (57), under "Abstract", in column 2, line 6, after "example" insert -- , --.

On the face page, in field (57), under "Abstract", in column 2, line 17, after "erased" insert -- , --.

In column 1, line 18, delete "10/4423,637" and insert -- 10/423,637 --, therefor.

In column 1, line 19, delete "Fairs" and insert -- Pairs --, therefor.

In column 1, line 54, delete "achieved" and
insert -- achieve further compactness by reducing the number of lines that --, therefor.

In column 1, line 60, after ""cell"" delete ",".

In column 2, line 24, delete "BB." and insert -- B–B. --, therefor.

In column 2, line 56, delete "transistors" and insert -- transistor, --, therefor.

In column 3, line 2, delete "shape" and insert -- shape, --, therefor.

In column 3, line 4, delete "TL shape" and insert -- L shape --, therefor.

In column 3, line 8, delete "correspondence" and insert -- correspondence, --, therefor.

In column 3, line 41, delete "stripe" and insert -- stripes --, therefor.

In column 3, line 61, after "that" insert -- is --.

In column 3, line 61, delete "one," and insert -- one --, therefor.

In column 4, line 4, delete "square/drain" and insert -- source/drain --, therefor.

In column 4, line 13, delete "sane" and insert -- same --, therefor.

UNITED STATES PATENT AND TRADEMARK OFFICE
CERTIFICATE OF CORRECTION

PATENT NO. : 7,439,567 B2
APPLICATION NO. : 11/463430
DATED : October 21, 2008
INVENTOR(S) : Bohumil Lojek It is certified that error appears in the above-identified patent and that said Letters Patent is hereby corrected as shown below:

In column 4, line 17, delete "separated" and insert -- separate --, therefor.

In column 4, line 30, after "FIG. 1" delete "with" and insert -- while --, therefor.

In column 4, line 33, after "which" delete "a".

In column 4, line 41, delete "aid" and insert -- and --, therefor.

In column 4, line 44, before "roughly" delete "thin" and insert -- thin, --, therefor.

In column 5, line 19, delete "transistors" and insert -- transistors, --, therefor.

Signed and Sealed this

Twenty-second Day of December, 2009

David J. Kappos
*Director of the United States Patent and Trademark Office*